(12) United States Patent
Xu et al.

(10) Patent No.: US 12,100,474 B2
(45) Date of Patent: Sep. 24, 2024

(54) CLOCK QUALIFIER ENHANCEMENT FOR EXTERNAL DOUBLE DATA RATE MEMORY INTERFACES

(71) Applicant: QUALCOMM Incorporated, San Diego, CA (US)

(72) Inventors: Yong Xu, San Diego, CA (US); Satish Krishnamoorthy, San Diego, CA (US); Boris Dimitrov Andreev, San Diego, CA (US); Patrick Isakanian, El Dorado Hills, CA (US); Farrukh Aquil, San Diego, CA (US); Vikas Mahendiyan, San Diego, CA (US); Ravindra Arvind Khedkar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 211 days.

(21) Appl. No.: 17/954,852

(22) Filed: Sep. 28, 2022

(65) Prior Publication Data

US 2024/0105243 A1 Mar. 28, 2024

(51) Int. Cl.
*G11C 7/10* (2006.01)
*G11C 7/14* (2006.01)
*G11C 7/22* (2006.01)

(52) U.S. Cl.
CPC .......... *G11C 7/222* (2013.01); *G11C 7/1066* (2013.01); *G11C 7/14* (2013.01)

(58) Field of Classification Search
CPC .................................................. G11C 7/1084
See application file for complete search history.

(56) References Cited

U.S. PATENT DOCUMENTS

| | | | |
|---|---|---|---|
| 10,861,508 B1 * | 12/2020 | Mathur | ............... G11C 7/1084 |
| 2014/0269117 A1 | 9/2014 | Maryan et al. | |
| 2018/0090190 A1 | 3/2018 | Hong | |
| 2018/0165023 A1 | 6/2018 | Oh et al. | |

OTHER PUBLICATIONS

International Search Report and Written Opinion—PCT/US2023/071253—ISA/EPO—Nov. 6, 2023.

* cited by examiner

*Primary Examiner* — Jason Lappas
(74) *Attorney, Agent, or Firm* — Loza & Loza, LLP

(57) ABSTRACT

A memory interface circuit has a first differential receiver having a first input coupled to a first reference voltage source, a second differential receiver configured to receive a differential data strobe signal in a pair of complementary signals, a third differential receiver having a first input coupled to a second reference voltage source and a second input configured to receive one of the pair of complementary signals, a clock generation circuit configured to generate a read clock signal based on an output of the second differential receiver and using a qualifying signal output by the third differential receiver to qualify one or more edges in the read clock signal and a data capture circuit clocked by the read clock signal and configured to capture data from the output of the first differential receiver using the one or more edges in the read clock signal.

30 Claims, 12 Drawing Sheets

CLOCK QUALIFIER ENHANCEMENT FOR EXTERNAL DOUBLE DATA RATE MEMORY INTERFACES

TECHNICAL FIELD

The present disclosure generally relates to a clock and data recovery circuits and, more particularly, to the inclusion and calibration of multiple reference voltage sources in a memory interface circuit.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include memory interfaces that have physical layer circuits that are configured to read and write double data rate random access memory devices. Increased demands for higher data rates require tight timing between circuits within the memory interface. Performance, accuracy or reliability of the memory interface may depend on calibration and training procedures that can accommodate voltage drift and other variances that can impact the operation of the memory interface. Therefore, there is an ongoing need for new techniques that provide reliable training and calibration techniques for components used to receive clock signals over high-speed data links.

SUMMARY

Certain aspects of the disclosure relate to systems, apparatus, methods and techniques for implementing and calibrating a memory interface circuit that can be used with clock signals that can have a frequency that varies over a wide range of frequencies.

In various aspects of the disclosure, a memory interface circuit has a first differential receiver having a first input coupled to a first reference voltage source, a second differential receiver configured to receive a differential data strobe signal in a pair of complementary signals, a third differential receiver having a first input coupled to a second reference voltage source and a second input configured to receive one of the pair of complementary signals, a clock generation circuit configured to generate a read clock signal based on an output of the second differential receiver and using a qualifying signal output by the third differential receiver to qualify one or more edges in the read clock signal and a data capture circuit clocked by the read clock signal and configured to capture data from the output of the first differential receiver using the one or more edges in the read clock signal. A differential receiver that has one of a pair of its inputs coupled to a reference voltage source may be referred to as a pseudo-differential receiver herein.

In various aspects of the disclosure, a method for communicating with a memory device includes coupling a first input of a first differential receiver to a first reference voltage source, configuring a second differential receiver to receive a differential data strobe signal in a pair of complementary signals, coupling a first input of a third differential receiver to a second reference voltage source, configuring a second input of the third differential receiver to receive one of the pair of complementary signals, configuring a clock generation circuit to generate a read clock signal based on an output of the second differential receiver and using a qualifying signal output by the third differential receiver to qualify one or more edges in the read clock signal and configuring a data capture circuit to capture data from the output of the first differential receiver using the one or more edges in the read clock signal.

In various aspects of the disclosure, an apparatus includes means for receiving a data signal, including a first differential receiver having a first input coupled to a first reference voltage source, means for receiving a differential data strobe signal in a pair of complementary signals, means for generating a qualifying signal by comparing one of the pair of complementary signals with an output of a second reference voltage source, means for generating a read clock signal based on an output of the means for receiving the differential data strobe signal and means for capturing data, configured to capture data from the output of the first differential receiver using the one or more edges in the read clock signal. Edges in the read clock signal may be qualified using the qualifying signal.

In various aspects of the disclosure, a processor-readable storage medium stores or maintains code for configuring a voltage level provided by a first reference voltage source to a first input of a first differential receiver; configuring a second differential receiver to receive a differential data strobe signal in a pair of complementary signals; configuring a voltage level provided by a second reference voltage source to a first input of a third differential receiver, which has a second input that receives one of the pair of complementary signals, configuring a clock generation circuit to generate a read clock signal based on an output of the second differential receiver and using a qualifying signal output by the third differential receiver to qualify one or more edges in the read clock signal and causing a data capture circuit to capture data from the output of the first differential receiver using the one or more edges in the read clock signal.

In certain aspects, the clock generation circuit includes a read capture window circuit configured to provide a qualified strobe signal by gating the output of the second differential receiver with pulses generated from edges in the qualifying signal. The clock generation circuit may include a calibrated delay circuit configured to provide the read clock signal by applying a delay to the qualified strobe signal.

In certain aspects, a controller may be configured to train the second reference voltage source by monitoring duty cycle of the qualifying signal for a plurality of values of a control signal provided to the second reference voltage source. The control signal may configure voltage level provided to the first input of the third differential receiver. The controller may be further configured to capture a plurality of samples of voltage levels of the qualifying signal, each of the plurality of samples being captured at different phases of the qualifying signal. The clock generation circuit may include a calibrated delay circuit configured to provide the read clock signal by applying a delay to a qualified strobe signal provided by the clock generation circuit. The controller may be further configured to configure the calibrated delay circuit to select a phase of the qualifying signal for each of the plurality of samples by delaying a sampling edge in the qualifying signal. The data capture circuit may be used to capture the plurality of samples.

In certain aspects, the controller may be further configured to train the first reference voltage source, wherein the first reference voltage source and the second reference voltage source are trained independently from each other.

In certain aspects, the second reference voltage source provides a calibrated voltage level to the first input of the third differential receiver. The calibrated voltage level may be configured to obtain a 50% duty cycle in the qualifying signal.

DETAILED DESCRIPTION

Figure 1:
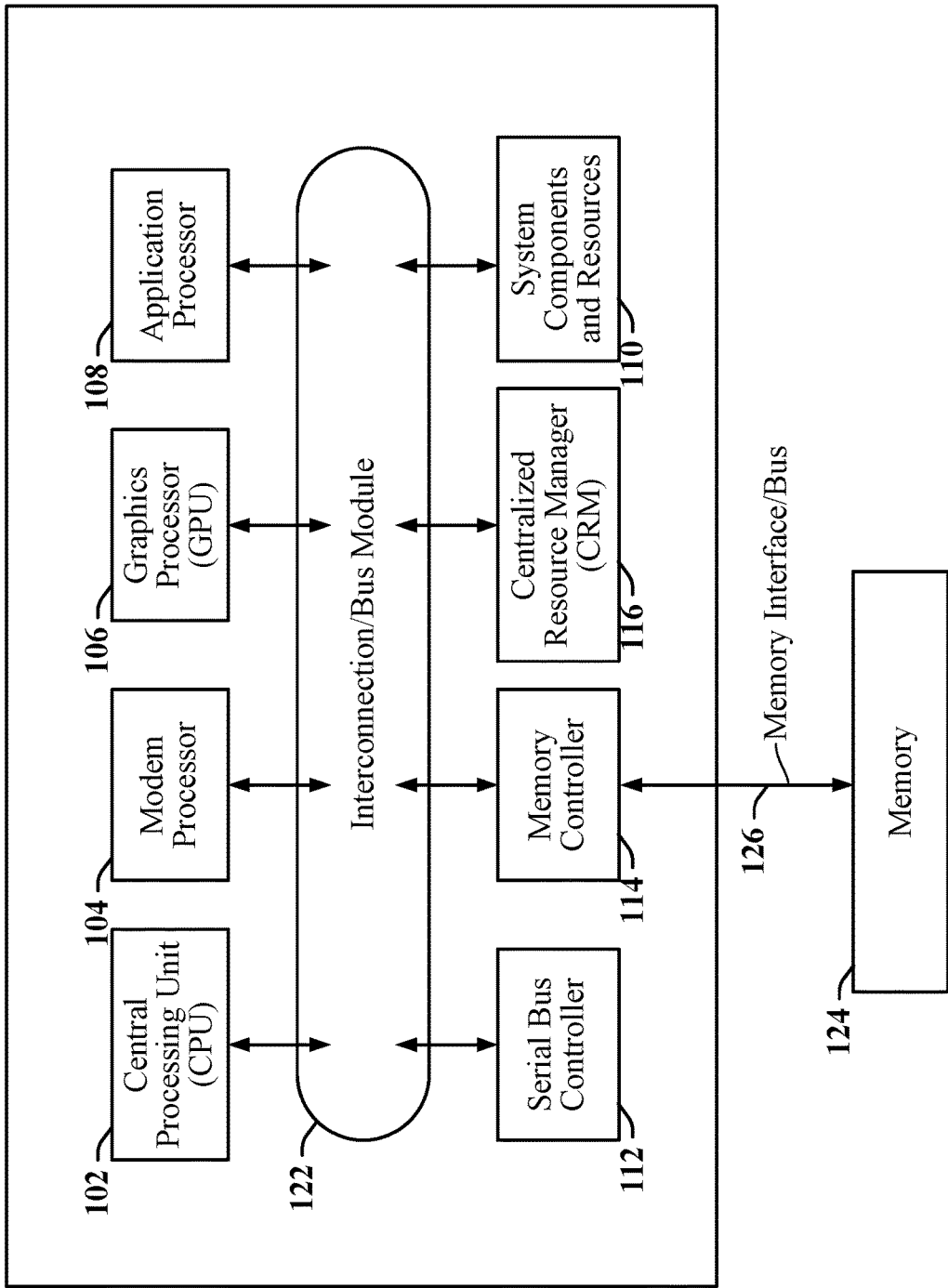
FIG. 1 illustrates example components and interconnections in a system-on-chip (SoC) that may be suitable for implementing certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Certain aspects of the disclosure are applicable to input/out (I/O) circuits that provide an interface between core circuits and memory devices. Many mobile devices employ Synchronous Dynamic Random Access Memory (SDRAM), including Low-Power Double Data Rate SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies may employ lower voltage levels in the core of an SoC or memory device to mitigate for increased power associated with the higher operating frequencies.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
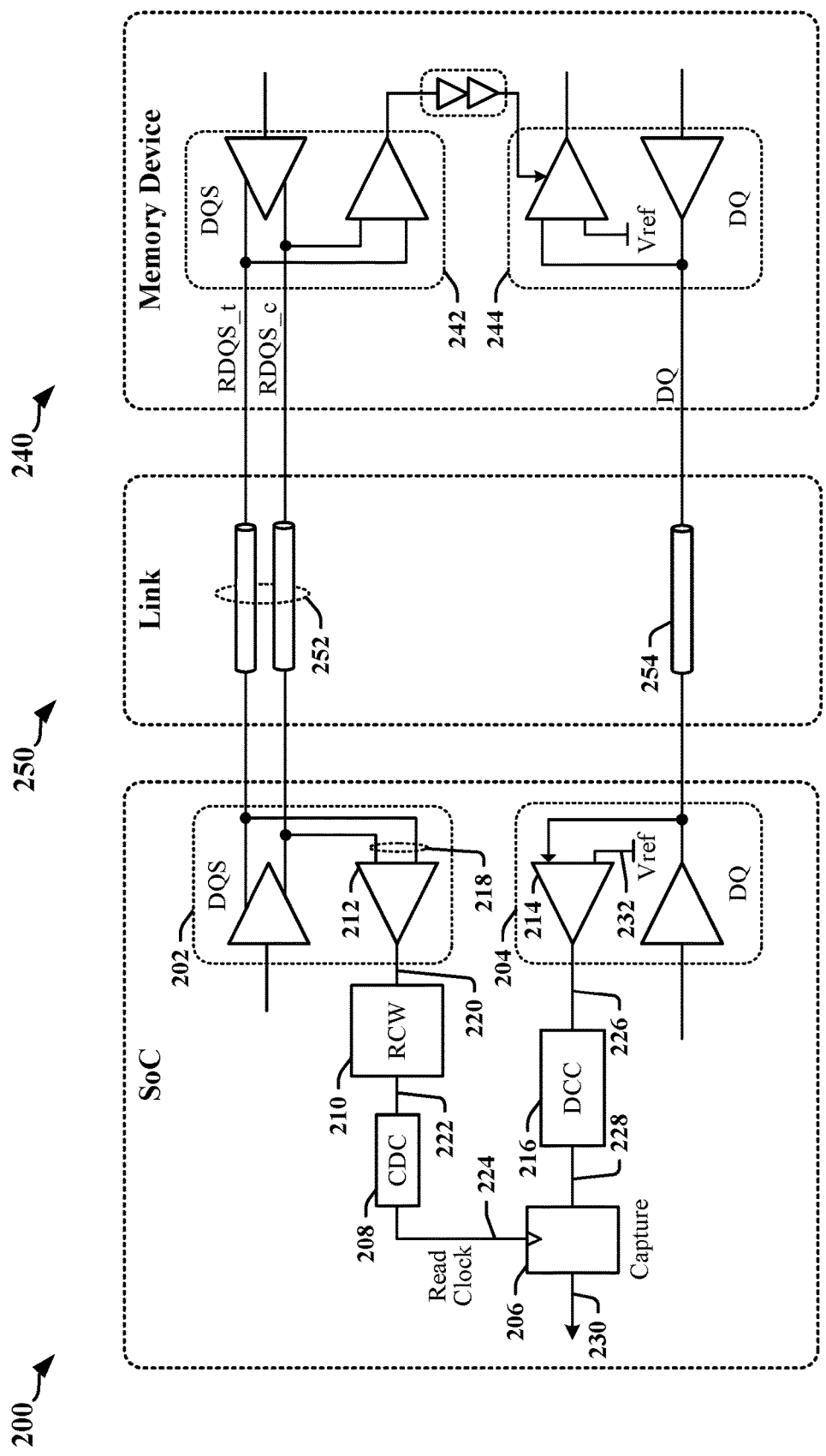
FIG. 2 illustrates aspects of physical layer circuits used to read data from a memory device over a data communication link.

FIG. 2 illustrates aspects of physical layer (PHY) circuits that enable an SoC 200 to read data from a memory device 240 over a data communication link 250. In the example shown in FIG. 2, a data channel 254 and data strobe channel 252 are illustrated. The channels 252, 254 may include wires, metal traces, pads, pins and other interconnects or elements of interconnects. The data channel 254 provides a signal path between a data pin (DQ) in a data transceiver 204 in the SoC 200 and a corresponding data pin (DQ) in a data transceiver 244 in the memory device 240. The data strobe channel 252 provides signal paths for the constituents (RDQS_t and RDQS_c) of a differential receive data strobe signal 218 received from a data strobe transceiver 242 in the memory device 240 to the data strobe transceiver 202 in the SoC 200. Edges or transitions in the data strobe signal 218 received over the data strobe channel 252 provide timing information that can be used to capture data bits from a data signal transmitted over the data channel 254.

The inputs of a differential strobe receiver 212 are configured to receive the differential strobe signal transmitted over the data strobe channel 252. The output of the differential strobe receiver 212 is a single-ended strobe signal 220 that is representative of the data strobe signal and is provided to a read capture window circuit (RCW 210). In one example, the RCW 210 is configured to provide a qualified signal 222 by aligning edges (transitions) in the single-ended strobe signal 220 with transitions in a received data signal 226 output by a pseudo-differential receiver 214 that receives the data signal from the data channel 254 at one input and a reference voltage level (Vref 232) at a second input. As used herein, the term pseudo-differential receiver may refer to a differential receiver that has one of a pair of its inputs coupled to a reference voltage source. In the illustrated example, a calibrated delay circuit (CDC 208) receives the qualified signal 222 and may be configured to produce a read clock signal 224 in which edges occur after transitions between bits in the received data signal 226. The illustrated example also includes a duty cycle correction circuit (DCC 216), that may be configured to maximize the time available for sampling each bit in the received data signal 226. In this example, the output 228 of the DCC 216 may be sampled by a data capture circuit 206 clocked by the read clock signal 224 to provide a data output 230. The data capture circuit 206 may include latches, flipflops, shift registers and combinational logic and other circuits.

Figure 3:
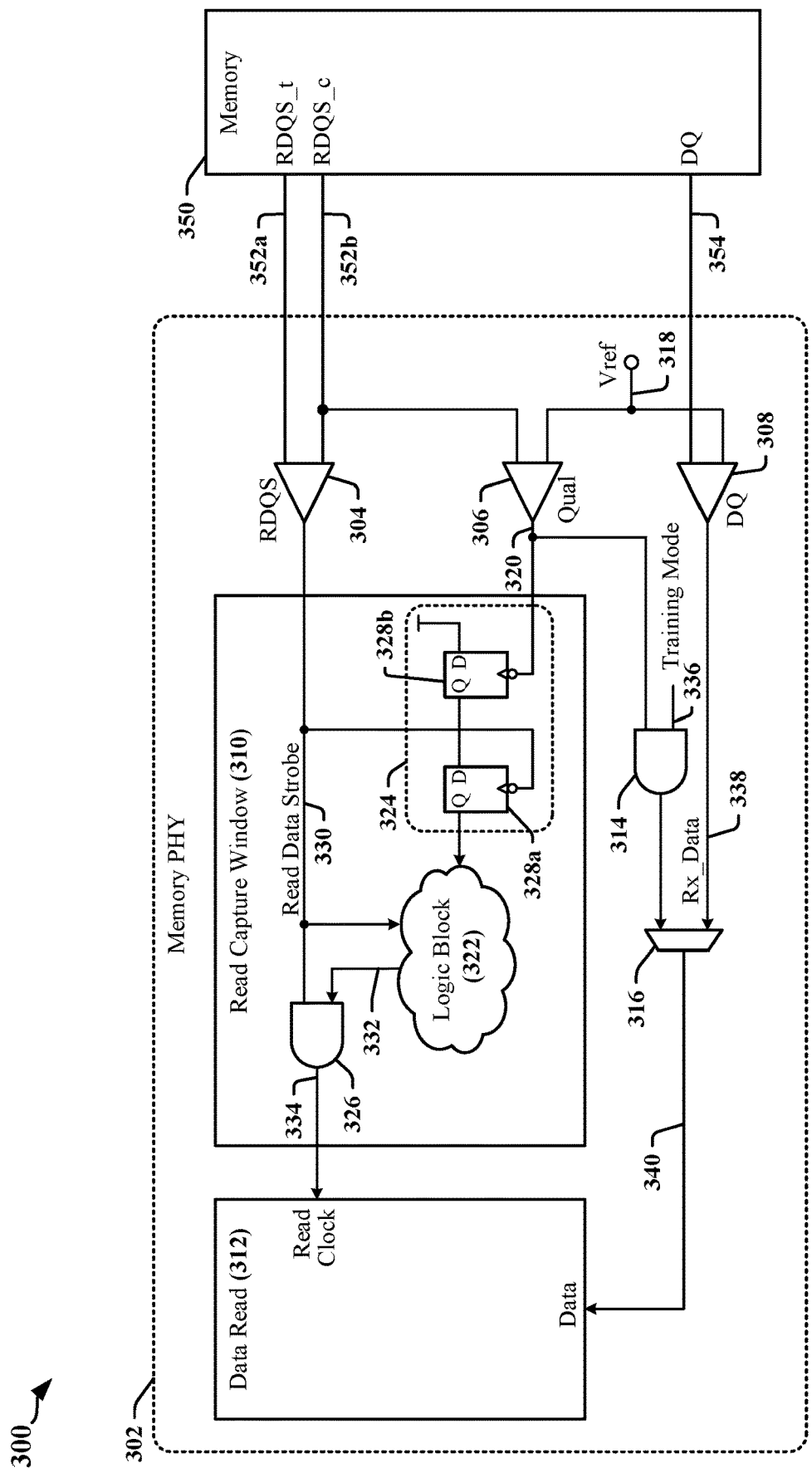
FIG. 3 illustrates certain aspects of an example of a memory interface that may be adapted in accordance with certain aspects of this disclosure.

FIG. 3 illustrates certain aspects of an example of a memory interface 300 that may be adapted in accordance with certain aspects of this disclosure. The memory interface 300 includes a memory PHY circuit 302 (e.g., LPDDR PHY) and a memory device 350 (e.g., LPDDR SDRAM). The memory PHY circuit 302 includes data read circuits that provide or support a data read path and its associated read data strobe path. Circuits that provide a data write path are omitted from FIG. 3. The illustrated memory PHY circuit 302 includes a read capture window block (RCW 310) and a data read block 312. The RCW 310 receives a read data strobe signal 330 from an RDQS differential receiver 304 coupled to a pair of interconnects that couple the memory PHY circuit 302 to the memory device 350. The memory device 350 transmits a differential strobe signal over the interconnects to the memory PHY circuit 302 as the RDQS_t signal 352a and the RDQS_c signal 352b. The RCW 310 can be configured to provide pulses in a read clock signal 334 that can be used by the data read block 312 to sample and capture data from a data signal received by the data read block 312.

The RCW 310 may be configured to propagate a second signal representative of the differential strobe signal into the data read block 312. For the purposes of this disclosure, the second signal representative of the differential strobe signal may be referred to as a qualifier signal, a qualifying signal or a qualify signal. The term "qualify an edge" may be used to indicate an aspect of the propagation of a qualifier signal into the data read block 312 through gating, ungating or otherwise modifying timing of an edge in a clock signal used for data capture.

In the illustrated example, a logic circuit configured as an AND gate 326 is used to control timing of edges in the read clock signal 334 by gating the read data strobe signal 330 with a timing control signal 332. The timing control signal 332 is generated using a logic block 322 and a pulse generation circuit 324 that respond to edges in the read data strobe signal 330 and in the RDQS_c signal 352b. A pseudo-differential receiver (Qual RX 306) provides a qualifier signal 320 by comparing the voltage state of the RDQS_c signal 352b with a reference voltage level (Vref 318). An edge in the qualifier signal 320 clocks a high voltage state through a first flipflop 328b and a corresponding edge in the read data strobe signal 330 clocks a second flipflop thereby propagating the high voltage state to the logic block 322. The logic block 322 includes timing and/or combinational logic that can alter the timing or duration of the high voltage state of the output of the second flipflop 328a. In some examples, the logic block 322 may terminate the pulse by resetting the first flipflop 328b and/or the second flipflop 328a after detecting a later edge in the read data strobe signal 330. In some examples, the logic block 322 may terminate the pulse at a point in time after the initial edge is detected in the RDQS_c signal 352b, where the point of termination may be controlled by configuring a delay circuit.

For each pulse in the RDQS_c signal 352b, the start of a pulse in the read clock signal 334 may be delayed by the timing control signal 332. The pulse in the read clock signal 334 may also be terminated by the timing control signal 332 before a corresponding pulse in the read clock signal 334 is terminated. The timing control signal 332 can be used to ensure that the read clock signal 334 is configured to enable the data read block 312 to reliably capture data transmitted by the memory device 350.

In the illustrated example, the memory device 350 transmits data in a single-ended data signal 354 (DQ). A pseudo-differential receiver (DQ RX 308) provides a received data signal (Rx_Data 338) by comparing the voltage state of the single-ended data signal 354 with Vref 318. Rx_Data 338 is coupled to the data read block 312 through a selection circuit 316 that can be used to select a calibration or test signal to be provided as an input signal 340 to the data read block 312 during a training procedure that may be performed to configure Vref 318. The selection circuit 316 may be implemented using a multiplexer circuit or combinational logic circuits. In some examples, a training mode is indicated by a mode select signal 336 that causes output of the qualifier signal 320 to be fed as a data signal to the data read block 312.

Figure 4:
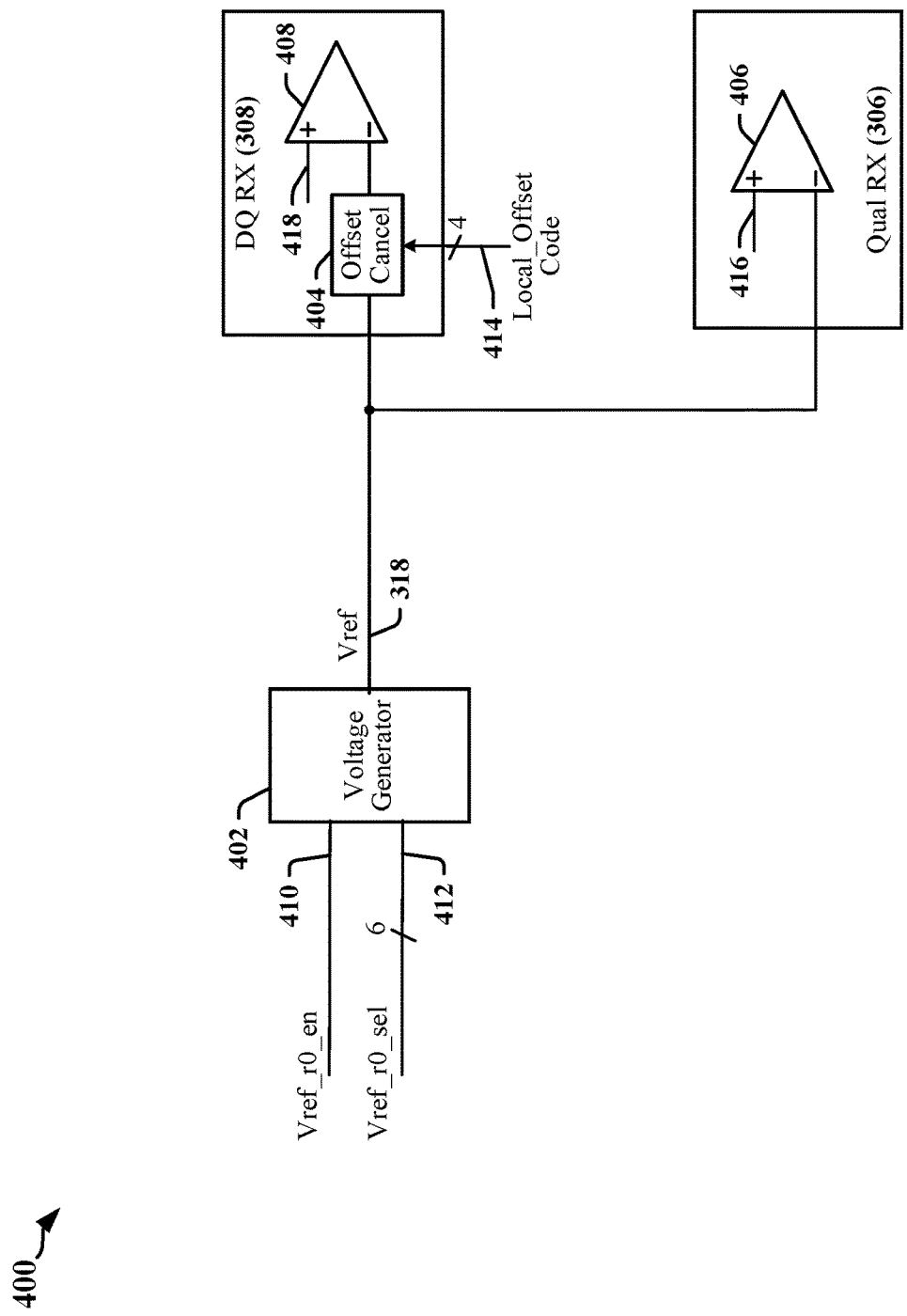
FIG. 4 illustrates an example of the generation and use of reference voltages for use in the memory interface illustrated in FIG. 3.

FIG. 4 illustrates an example 400 of the generation and use of Vref 318 in the memory PHY circuit 302 illustrated in FIG. 3. The pseudo-differential receivers 306 and 308 in the memory PHY circuit 302 include differential receivers 406, 408 that are based on the same type of differential receiver design. Vref 318 is generated using a configurable voltage generator 402 that is controlled using one or more control signals. In the illustrated example, the output of voltage generator 402 may be turned on or turned off using a first control signal (Vref_r0_en 410), and the voltage of Vref 318 may be selected using a second control signal (Vref_r0_sel 412). Vref 318 determines a reference voltage used by each of the differential receivers 406, 408 to compare voltage of respective input signals 416, 418. In some implementations, the differential receiver 408 in the read data path may be calibrated using a voltage offset cancellation circuit 404 that can accommodate voltage offsets or drift attributable to the use of a single-ended signaling. In the illustrated example, the voltage offset cancellation circuit 404 is configured using a 4-bit control signal 414. The read data strobe is transmitted as a differential signal and it can be expected that common-mode voltage offsets are cancelled at the differential receiver limiting or eliminating the need for offset cancellation at the RDQS differential receiver 304. The Qual RX 306 effectively operates as a single-ended receiver and may be affected by an offset voltage or voltage drift in the RDQS_c signal 352b.

The training procedure in conventional PHY circuits trains Vref 318 to optimize the operation of the differential receiver 408 in the read data path. In these conventional PHY circuits, it is often assumed that a Vref 318 trained to optimize read data capture also optimizes the operation of the RCW 310. However, this assumption may not hold under all operating conditions or frequencies, especially at high frequencies mandated by newer generations of LPDDR standards. In one example, it can be preferable to optimize timing aspects of the operation of the Qual RX 306 and preferable to optimize responsiveness to voltage levels by the DQ RX 308.

The conventional training procedure trains Vref 318 in a manner that optimizes the DQ RX 308 in the read data path and timing characteristics of the RCW-related, Qual RX 306 may be compromised. The operation of the RCW 310 requires tight timing between the RDQS differential receiver 304 and the Qual RX 306 and the conventional training procedures may result in a sub-optimal timing relationship between these receivers 304 and 306. The Qual RX 306 and the DQ RX 308 have different purposes and receive signals from different sources that may introduce different timing offsets or phase shifts. In some instances, the DQ RX 308 includes a voltage offset cancellation circuit 404 and the lack of voltage offset cancellation in the Qual RX 306 can result in differences in operating points between the Qual RX 306 and the DQ RX 308. In some instances, read clock errors may result when timing violations occur between the qualifier signal 320 and the read data strobe signal 330 due to sub-optimal training of Vref 318 for the RCW 310.

Figure 5:
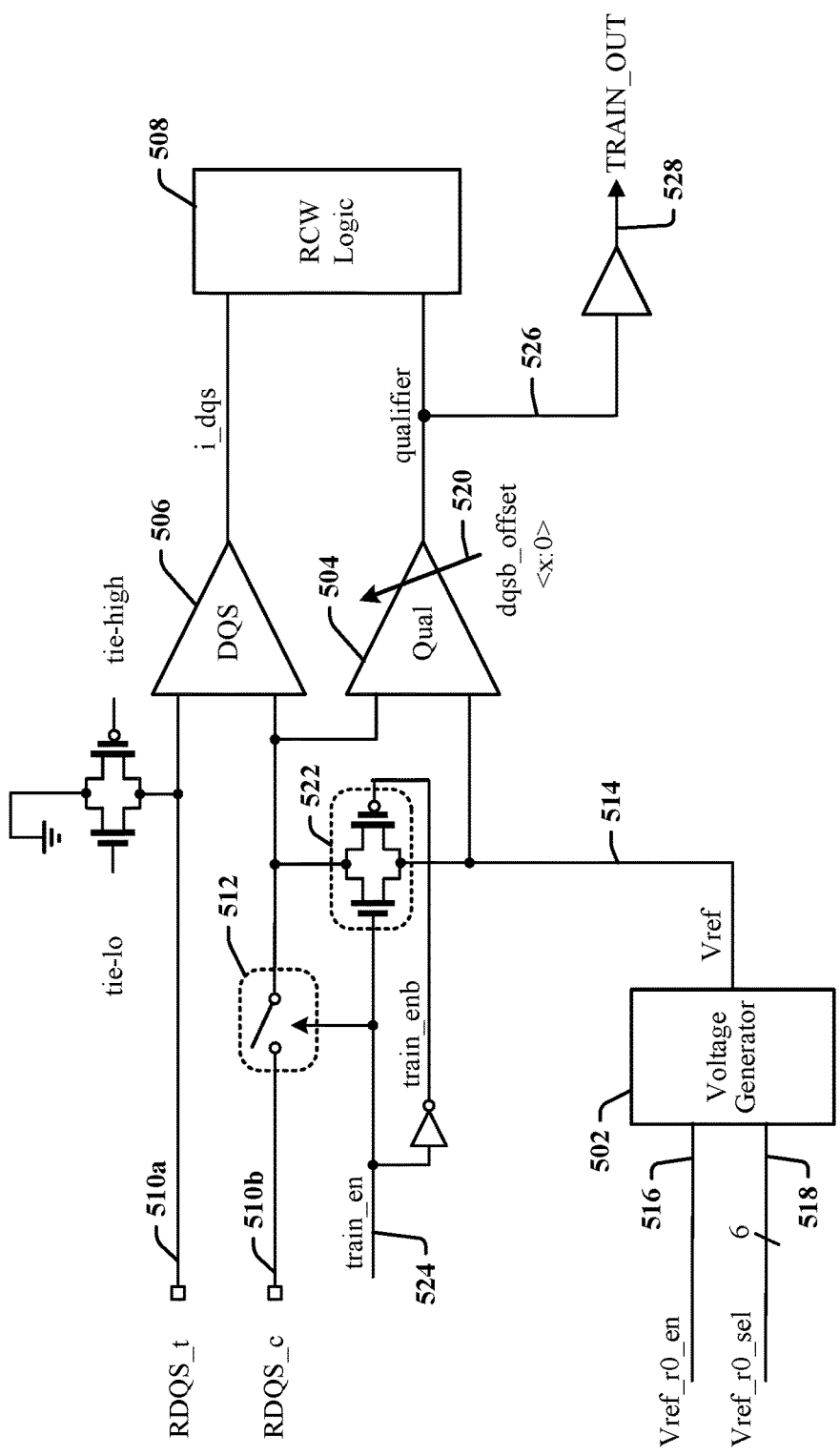
FIG. 5 illustrates a portion of a physical layer circuit that includes a voltage offset cancellation circuit in accordance with certain aspects of this disclosure.
Figure 6:
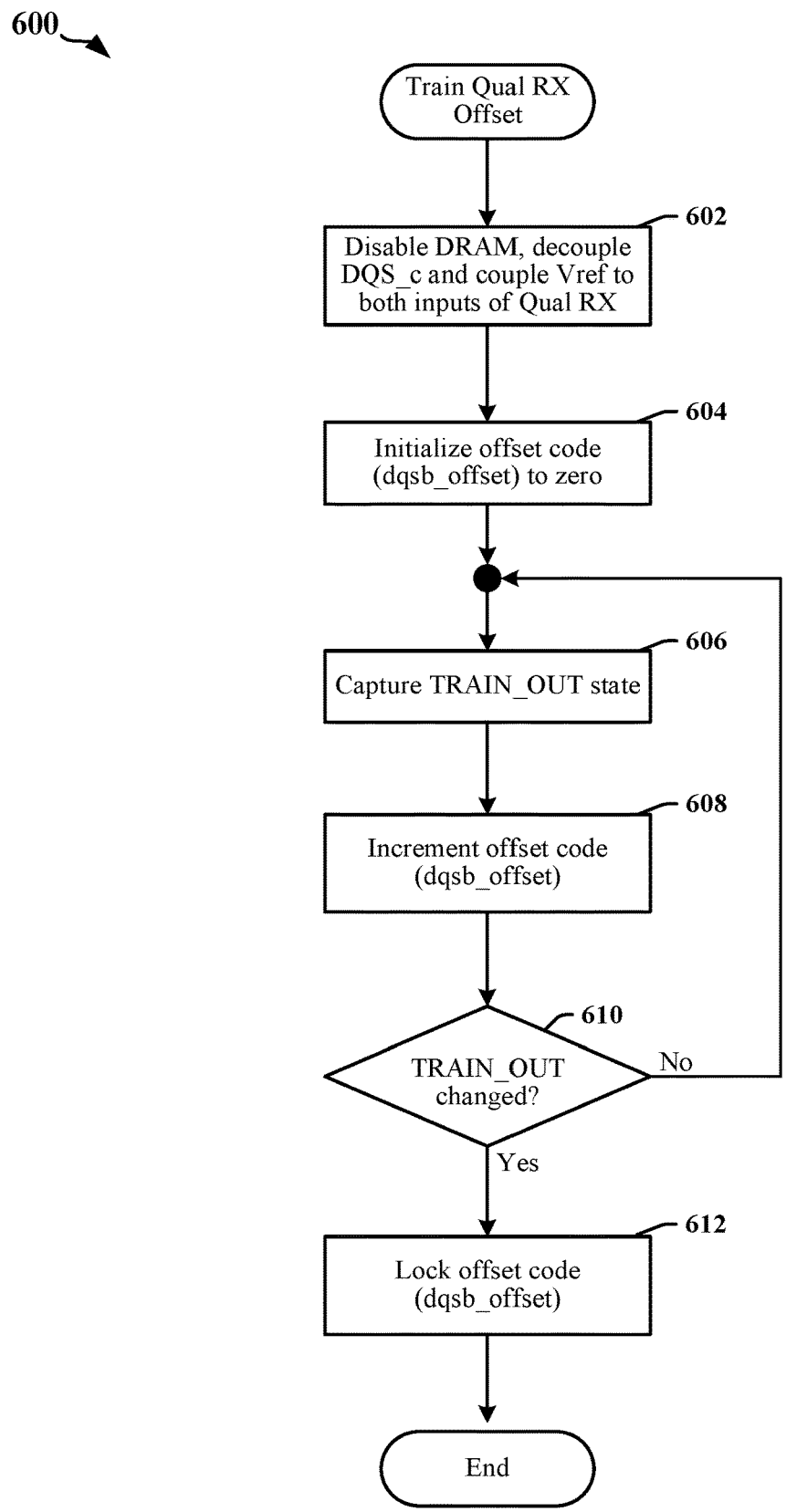
FIG. 6 is a flowchart that illustrates a secondary training procedure for the physical layer circuit illustrated in FIG. 5.

Certain aspects of this disclosure provide for additional training or calibration of the operation of the Qual RX 306 and/or of the RDQS differential receiver 304. FIG. 5 illustrates a portion of a memory PHY circuit 500 that includes a DQS differential receiver (DQS RX 506) that receives the complementary RDQS_t signal 510a and RDQS_c signal 510b and a pseudo-differential receiver (Qual RX 504) that includes a voltage offset cancellation circuit in accordance with certain aspects of this disclosure. Qual RX 504 and DQS RX 506 drive the read capture window circuit (RCW circuit 508). FIG. 6 is a flowchart 600 that illustrates a secondary training procedure for the Qual RX 504. At block 602, the memory PHY circuit 500 may be configured for training. A voltage generator 502 may be enabled using a Vref_r0_en control signal 516 and the output voltage (Vref 514) may be configured using a previously determined value for Vref_r0_sel 518. In one example, a primary training procedure directed to optimizing the data path may yield the previously determined value for Vref_r0_sel 518. Vref 514 is coupled to a first input of Qual RX 504. The second input of Qual RX 504 may also be coupled to Vref 514 during training. In one example, the second input of Qual RX 504 may be decoupled from the RDQS_c signal 510b by opening the transistor switch 512 and a transmission gate 522 may be enabled to couple Vref 514 to the second input of Qual RX 504. The transistor switch 512 and transmission gate 522 may be controlled by a training enable control signal (train_en 524). The memory device coupled to the memory PHY circuit 500 may be disabled before commencing secondary training. In one example, the DRAM may be placed in a mode of operation in which its data and/or strobe outputs are maintained in a high-impedance state. At block 604, a control signal (dqsb_offset 520) for an offset cancel circuit in Qual RX 504 may be set to a lowest setting. In the illustrated example, dqsb_offset 520 may be provided as a multibit binary value and dqsb_offset 520 may be initialized to a zero value in block 604.

At block 606 the state of a training output signal 528 may be sampled to otherwise captured. The training output signal 528 may be derived from an output of the Qual RX 504 that provides the qualifier signal 526 in normal or non-training modes of operation. At block 608, dqsb_offset 520 is incremented. At block 610, the state of the training output signal 528 is compared with the state captured in block 606. When no change in the state of the training output signal 528 is detected, the training procedure returns to block 606 for another iteration. When a change in the state of the training output signal 528 is detected, the training procedure continues at block 612. At block 612 the current setting of dqsb_offset 520 is locked for use in normal modes of operation. The current setting of dqsb_offset 520 may be recorded or maintained as a binary code. Then the secondary training procedure may end.

Figure 7:
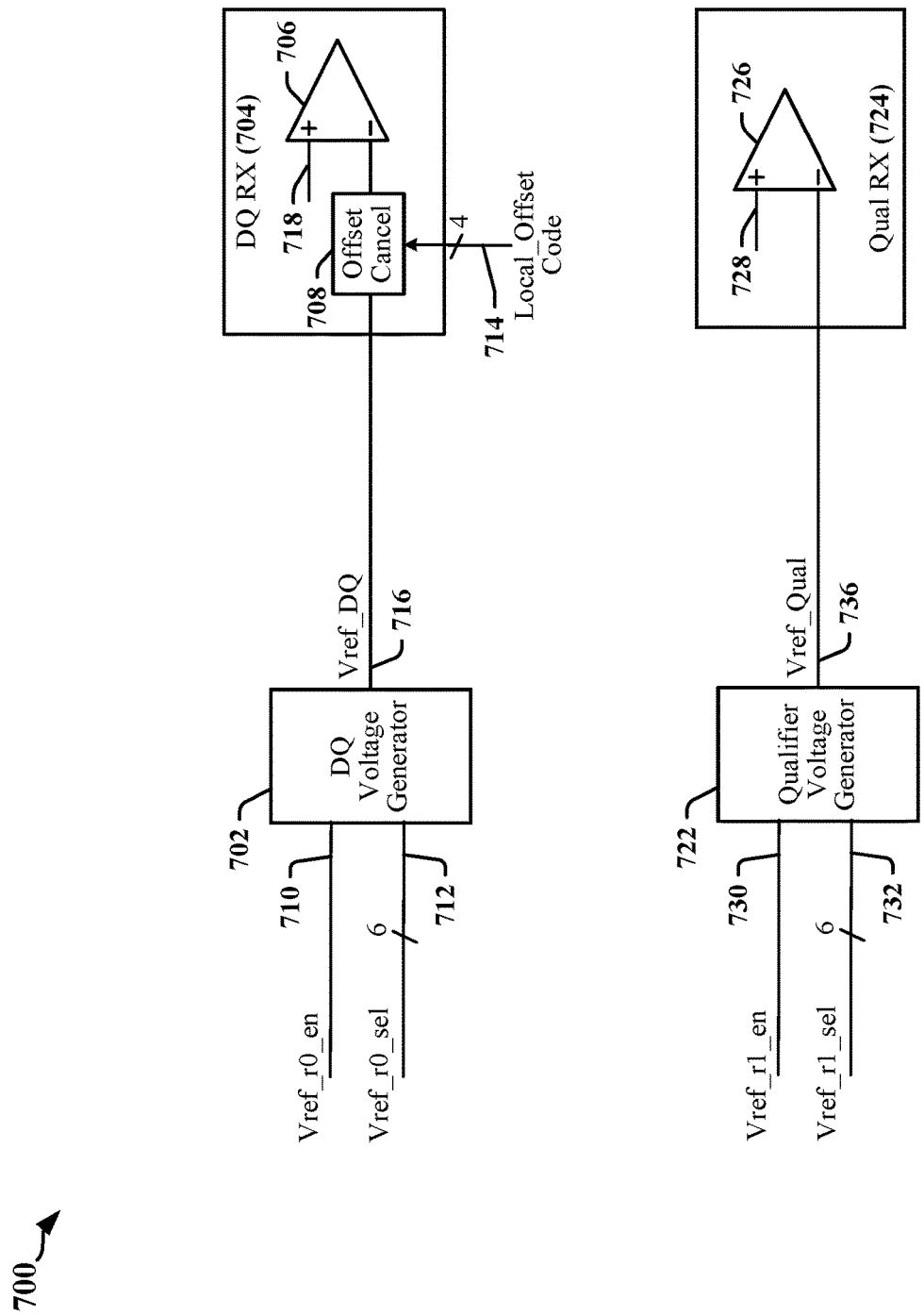
FIG. 7 illustrates an example of the use of multiple voltage generators in a memory physical interface circuit that has been configured in accordance with certain aspects of this disclosure.

Certain aspects of this disclosure relate to memory PHY circuits that employ multiple independently configurable voltage references. FIG. 7 illustrates an example 700 of the use of multiple voltage generators 702, 722 in a memory PHY circuit. In one example, the memory PHY circuit 302 illustrated in FIG. 3 may be adapted to incorporate the voltage generators 702, 722. A pair of pseudo-differential receivers 704 and 724 include differential receivers 706, 726 respectively that may be based on the same or a different type of differential receiver design.

A first configurable voltage generator, the DQ voltage generator 702, provides a reference voltage level (Vref_DQ 716) to the first pseudo-differential receiver (DQ RX 704). Vref_DQ 716 is configured or controlled using one or more control signals 710, 712. In the illustrated example, the output of voltage generator 702 may be turned on or turned off using a first control signal (Vref_r0_en 710), and the voltage level of Vref_DQ 716 may be selected using a second control signal (Vref_r0_sel 712). Vref_DQ 716 determines the reference voltage used by DQ RX 704 to compare or ascertain the voltage of input signal 718. In some implementations, DQ RX 704 is deployed in the read data path of the memory PHY and may be calibrated using a voltage offset cancellation circuit 708 that can accommodate voltage offsets or drift attributable to the use of a single-ended signaling. In the illustrated example, the voltage offset cancellation circuit 708 is configured using a 4-bit control signal 714.

A second configurable voltage generator, the Qual voltage generator 722, provides a reference voltage level (Vref_DQ 736) to a second differential receiver (Qual RX 724). Vref_DQ 736 is configured or controlled using one or more control signals 730, 732. In the illustrated example, the output of the Qual voltage generator 722 may be turned on or turned off using a first control signal (Vref_r1_en 730), and the voltage level of Vref_Qual 736 may be selected using a second control signal (Vref_r1_sel 732). Vref_Qual 736 determines the reference voltage used by Qual RX 724 to compare or ascertain the voltage of input signal 728. In some implementations, Qual RX 724 is deployed in the data strobe path of the memory PHY. In some implementations, Qual RX 724 may be calibrated using a voltage offset cancellation circuit (not shown) that can accommodate voltage offsets or drift attributable to the use of a single-ended signaling.

Figure 8:
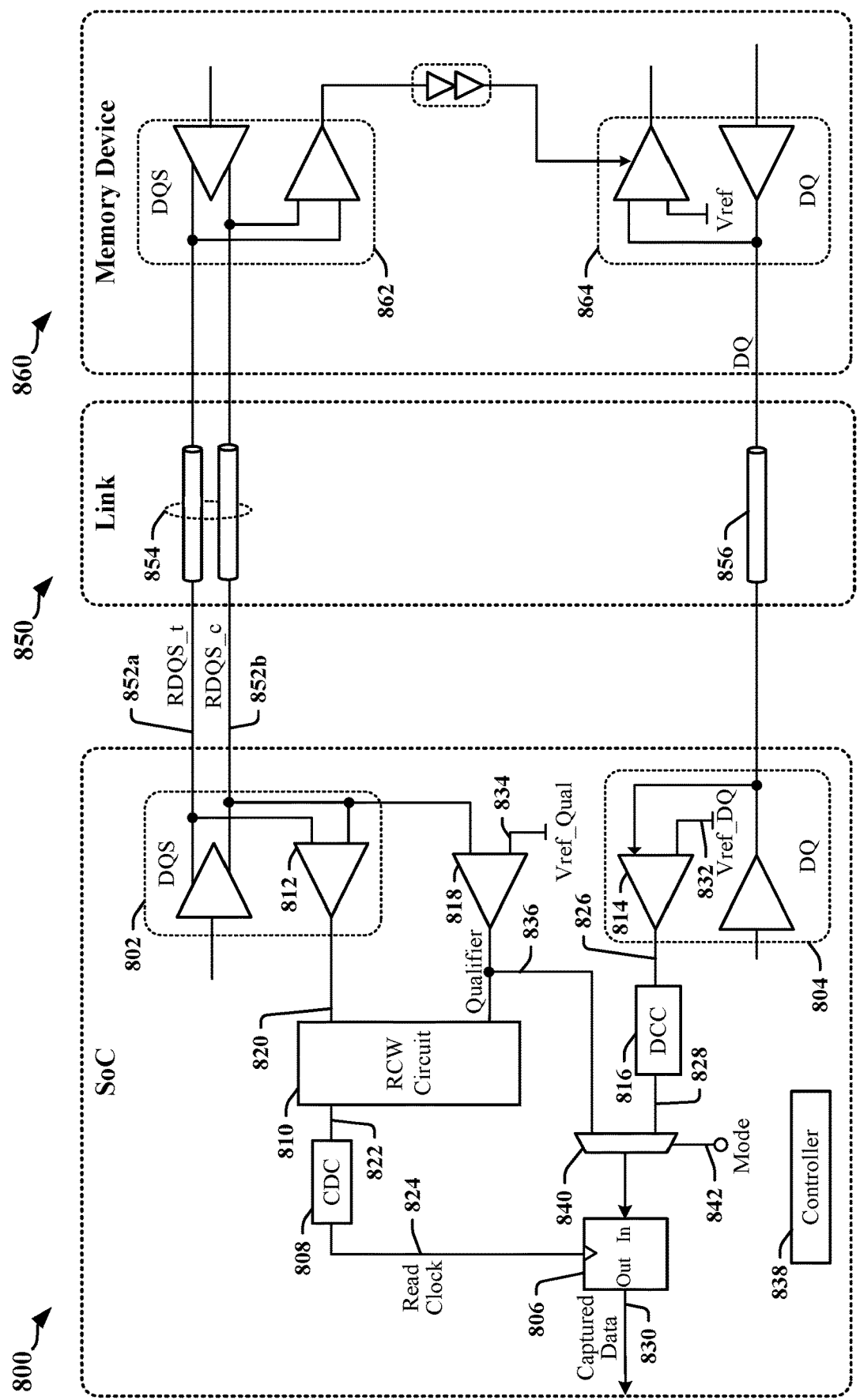
FIG. 8 illustrates a memory interface configured in accordance with certain aspects of this disclosure.

FIG. 8 illustrates aspects of a memory interface configured in accordance with certain aspects of this disclosure. The memory interface includes PHY circuits that enable an SoC 800 to read data from a memory device 860 over a data communication link 850. In the illustrated example, a data channel 856 and data strobe channel 854 are illustrated. The data channel 856 may be one of multiple data channels that implement a parallel bus that couples the SoC 800 to the memory device 860. The channels 854, 856 may be implemented using some combination of wires, metal traces, pads, pins and other interconnects or elements of interconnects. The data channel 856 provides a signal path between a data pin (DQ) in a data transceiver 804 in the SoC 800 and a corresponding data pin (DQ) in a data transceiver 864 in the memory device 860. The data strobe channel 854 provides signal paths for the constituents (RDQS_t 852a and RDQS_c 852b) of a differential receive data strobe signal transmitted from a data strobe transceiver 862 in the memory device 860 to the data strobe transceiver 802 in the SoC 800. Edges or transitions in the data strobe signal transmitted over the data strobe channel 854 provides timing information that can be used to capture data bits from a data signal transmitted over the data channel 856.

The inputs of a differential strobe receiver (DQS RX 812) are configured to receive the differential strobe signal transmitted over the data strobe channel 854. The output of DQS RX 812 is a single-ended strobe signal 820 that is representative of the data strobe signal and is provided to a read capture window circuit (RCW circuit 810). In one example, the RCW circuit 810 is configured to receive the single-ended strobe signal 820 and a qualifier signal 836 that is representative of RDQS_c 852b and to produce an output signal 822 that includes pulses that can be used to control sampling or capture of data carried in a received data signal 826 output by a first pseudo-differential receiver (DQ RX 814). The qualifier signal 836 is output by a second pseudo-differential receiver (Qual RX 818) that receives RDQS_c 852b and a first reference signal (Vref_Qual 834) as inputs. The DQ RX 814 receives a data signal from the data channel 856 and a second reference signal (Vref_DQ 832) as inputs.

In the illustrated example, a calibrated delay circuit (CDC 808) may be configured to delay the output signal 822 provided by the RCW circuit 810 to obtain a read clock signal 824 in which edges occur after transitions between bits in the received data signal 826. In some implementations, the RCW circuit 810 corresponds to the RCW 310 illustrated in FIG. 3. The illustrated example also includes a duty cycle correction circuit (DCC 816), that receives the received data signal 826 and may be configured to output a corrected received data signal 828 that maximizes the time available for sampling each bit of data. In this example, the corrected received data signal 828 may be sampled by a data capture circuit 806 clocked by the read clock signal 824 in normal operating modes. The data capture circuit 806 may include latches, flipflops, shift registers and combinational logic and other circuits and may output a captured data signal 830.

Certain aspects of this disclosure relate to a training procedure that targets Vref_Qual 834, which may be trained independently of Vref_DQ 832. The training procedure employs a combination of hardware and software modules that work in concert to optimize certain aspects of the RCW 310. In one example, Vref_Qual 834 is trained to provide a voltage level that causes Qual RX 818 to output the qualifier signal 836 with a 50% duty cycle in response to a 50% duty cycle input signal.

In certain implementations, Vref_Qual 834 is trained by incrementally increasing the voltage level of Vref_Qual 834 and sampling the qualifier signal 836 at different phases of the cycle of the qualifier signal 836. The phases at which samples are captured may be selected using the CDC 808. For each voltage level of Vref_Qual 834, a portion of the cycle of the qualifier signal 836 may be swept by capturing samples of the voltage level at the phase associated with each delay value configured for the CDC 808. In one example, a first portion of the cycle of the qualifier signal 836 in which the rising edge of a pulse may be expected can swept and recorded as a first pattern of voltage states. A second portion of the cycle of the qualifier signal 836 in which the falling edge of a pulse may be expected can swept and recorded as a second pattern of voltage states. The first and second patterns can be compared to determine the duration of each voltage stage, measured in the number of samples that record that voltage state. The patterns of voltage state may be captured from one or more shift registers configured to hold a sequence of samples captured during a sweep.

Figure 9:
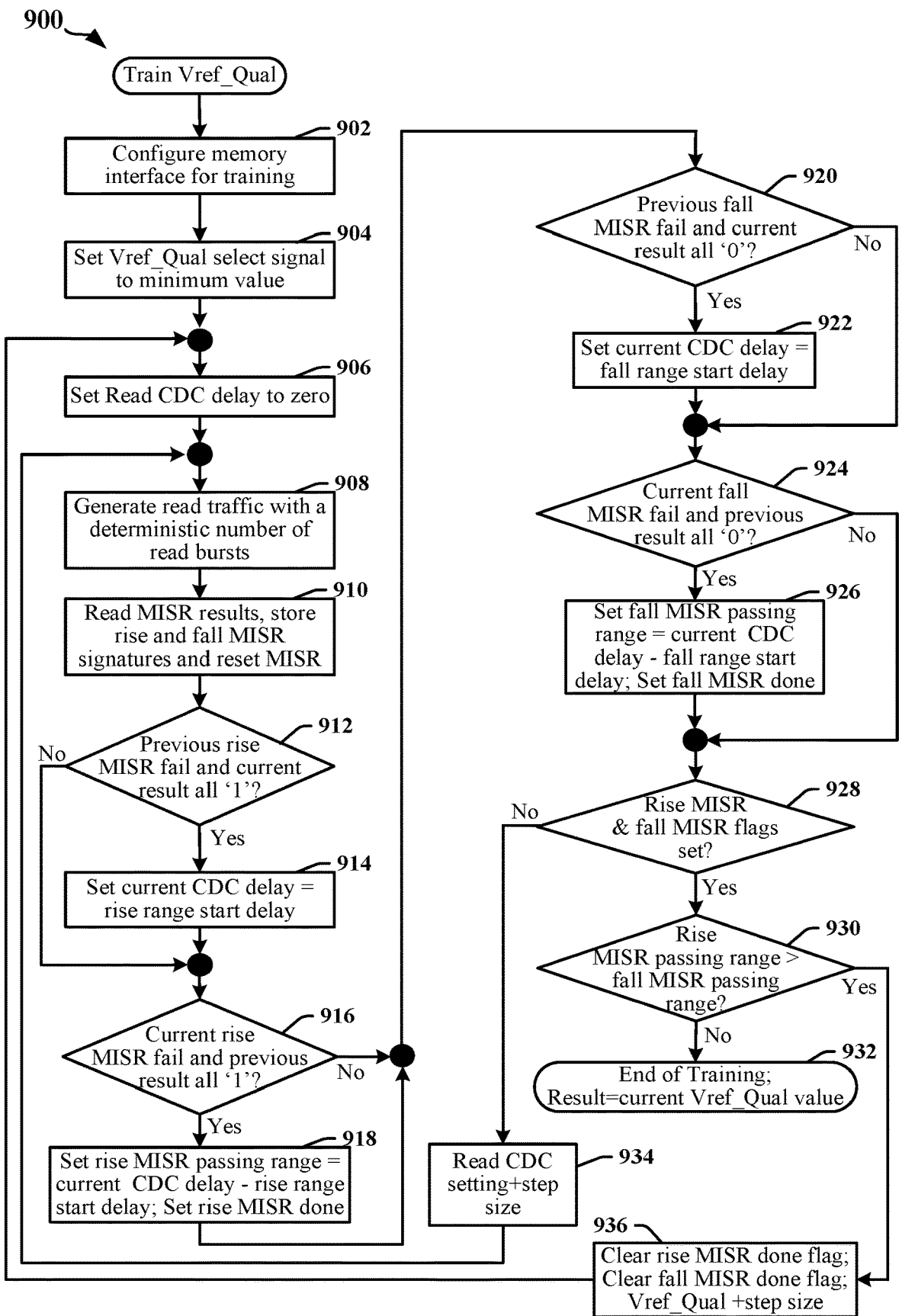
FIG. 9 is a flowchart that illustrates an example of a training procedure provided in accordance with certain aspects of this disclosure.

An example of a training procedure is provided in the flowchart 900 of FIG. 9. Portions of the training procedure may be configured, initiated, monitored and/or controlled using a controller circuit 838. The controller circuit 838 may include a microprocessor, microcontroller, finite state machine, sequencing logic or other types of processing devices. At block 902, the memory interface may be reconfigured to support the training procedure. Certain circuits, flags, interrupts and/or messaging may be disabled to cause upper layer protocol handlers and applications to ignore activity on the bus used to couple the PHY circuits to memory devices. In certain implementations, the memory devices may be disabled by command issued from a controller in the SoC memory PHY. In some examples, shift registers, latches, buffers and error detection/error handling circuits or modules may be disabled to prevent read hang conditions, where a read transaction is not completed. In some examples, certain other microcontrollers or finite state machines may be caused to enter an idle state during the training procedure.

In certain implementations, the RCW circuit 810 may be enabled in order to commence the training procedure. In some instances, certain functions of the RCW circuit 810 may be reconfigured to enable the training procedure to be executed, and a control signal may be provided to cause the RCW circuit 810 to enter a training mode of operation. In some instances, the RCW circuit 810 may be configured for normal operations while the training procedure is executed. For the purposes of training, the qualifier signal 836 is provided as a data stream to the data capture circuit 806.

The qualifier signal 836 may be coupled to the data capture circuit 806 through a selection circuit such as a multiplexer 840. The multiplexer 840 responds to a mode control signal 842. In a first mode indicated by the mode control signal 842, the multiplexer 840 couples the corrected received data signal 828 to the input of the data capture circuit 806. The first mode may correspond to a normal operating mode. In a second mode indicated by the mode control signal 842, the multiplexer 840 couples the qualifier signal 836 to the input of the data capture circuit 806. The second mode may correspond to a training mode in which a training procedure may be executed. During training procedures, the SoC memory PHY may be configured for training at a target frequency, which may exceed 2 GHz in some instances.

At block 904, Vref_Qual 834 is set to a minimum value. In one example, the voltage level of Vref_Qual 736 may be selected by configuring Vref_r1_sel 732 of the voltage generator 722 illustrated in FIG. 7. The CDC 808 may be initially configured to introduce a minimum or no delay at block 906.

Figure 10:
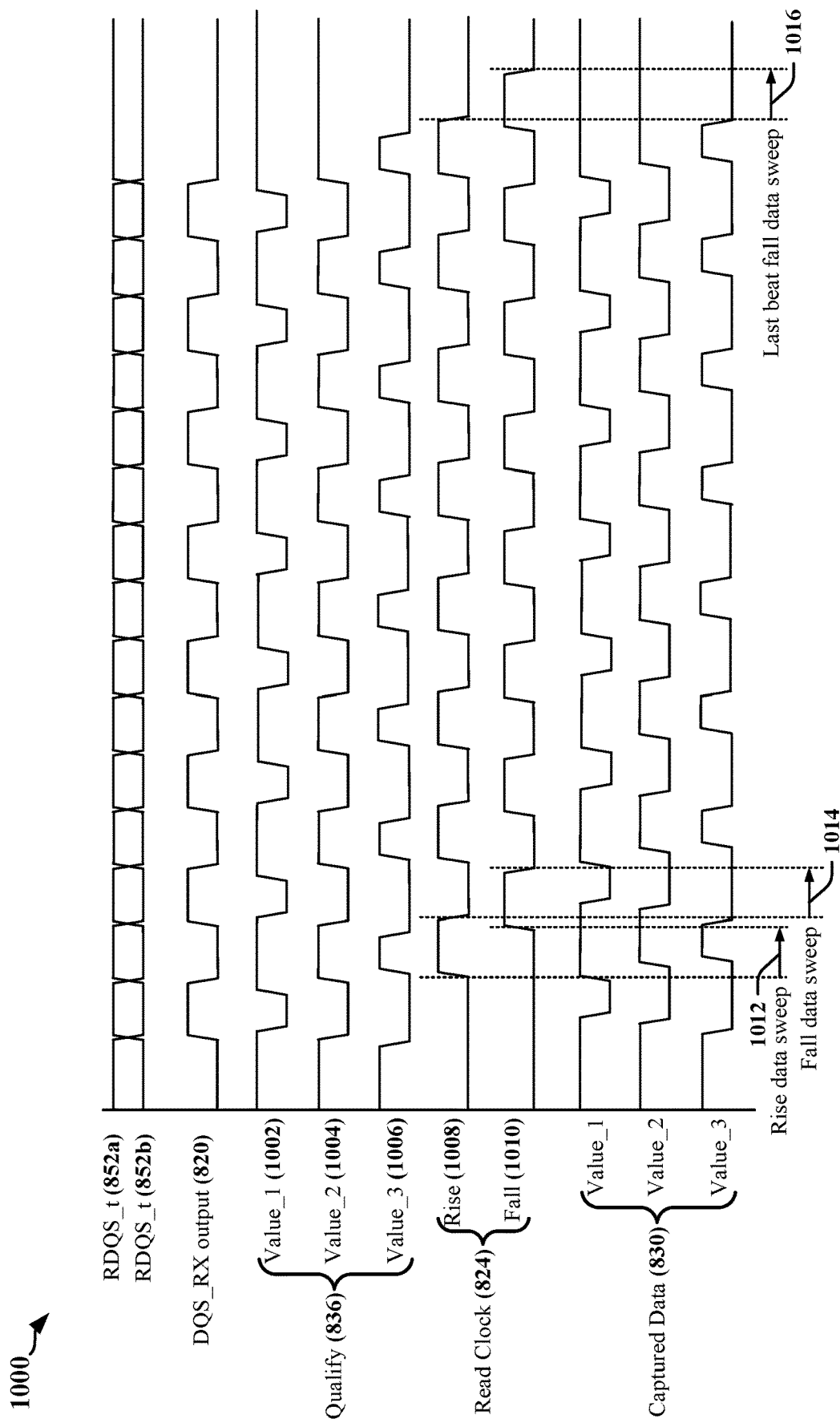
FIG. 10 illustrates the timing corresponding to the training procedure illustrated in FIG. 9.
Figure 11:
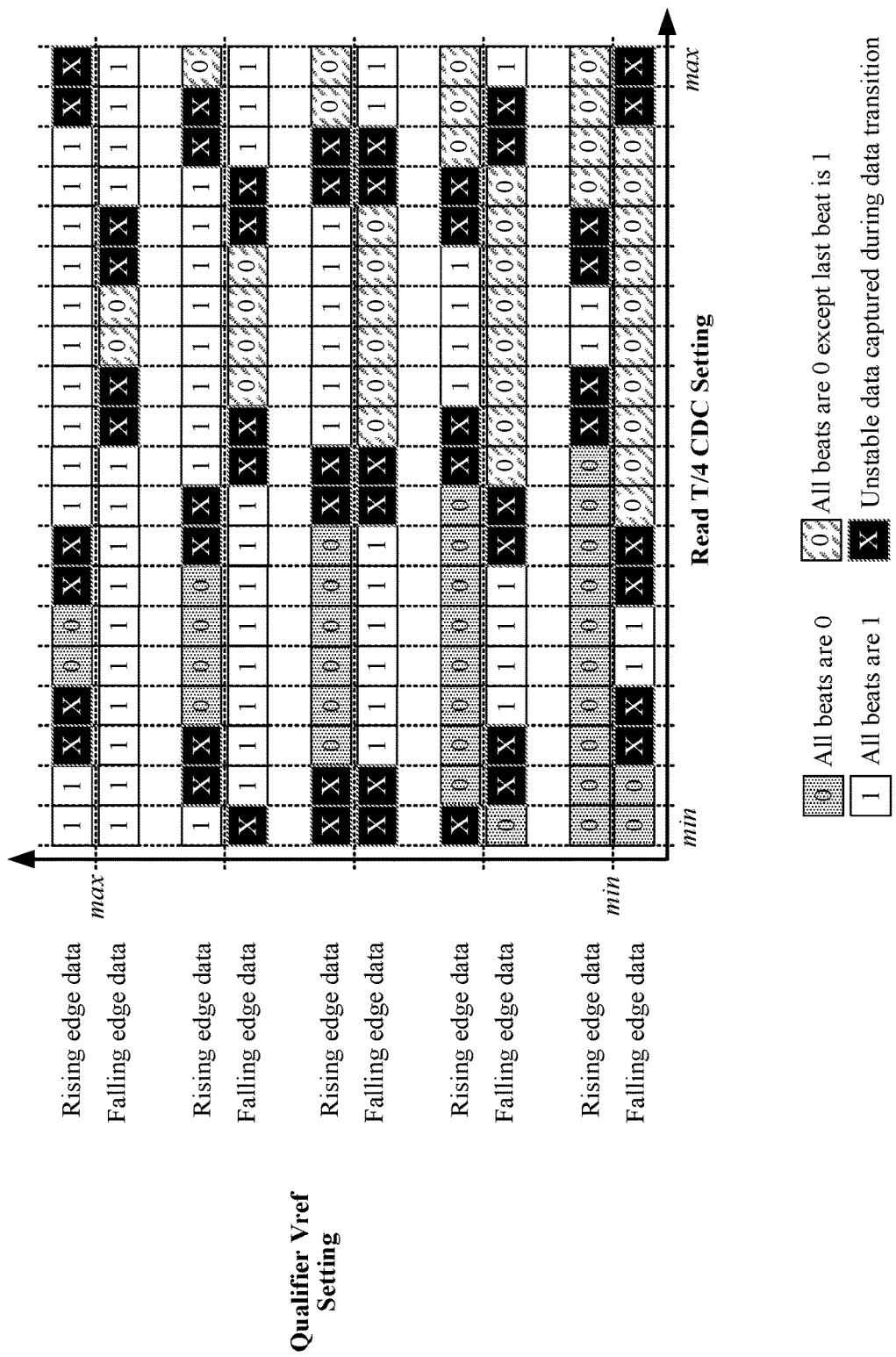
FIG. 11 shows examples of patterns corresponding to the training procedure illustrated in FIG. 9 and the timing illustrated in FIG. 10.

Referring also to FIGS. 10 and 11, the training procedure may be monitored using a multiple input shift register (MISR) that is configured to capture state of the qualify signal 822 at multiple sampling points within each clock cycle of the qualify signal 822. Each sampling point may correspond to a phase of the qualify signal 822. In some examples, a pattern or signature in the captured state may indicate the duty cycle of the qualify signal 822. In some implementations, a deterministic or predefined pattern of data may be generated and provided as read traffic to the memory PHY. Captured state may be examined based on the known or expected content of the read traffic in order to calibrate or train timing elements used to generate the read clock signal 824.

FIG. 10 is a timing diagram 1000 that illustrates the relative timing of RDQS_t 852a and RDQS_c 852b and the qualify signal 822 for three different Vref_Qual 736 values 1002, 1004, 1006. The Vref_Qual 736 settings result in different duty cycles. The first Vref_Qual 736 value 1002 produces a 70/30 duty cycle the qualify signal 822, the second Vref_Qual 736 value 1004 produces a 50/50 duty cycle the qualify signal 822 and the third Vref_Qual 736 value 1006 produces a 30/70 duty cycle in the qualify signal 822. In a first mode of capture 1008, the delay provided by the CDC 808 may be configured to sweep the time period 1012 during which rising edges in the qualify signal 822 can occur. In a second mode of capture 1010, the delay provided by the CDC 808 may be configured to sweep the time period 1014 during which falling edges in the qualify signal 822 can occur. In the second mode of capture 1010, the CDC 808 may be configured to sweep the time period 1016 associated with a falling edge of the last pulse or beat in the qualify signal 822. Patterns in the state information captured during the sweeps may be used to determine the duty cycle of the qualify signal 822. FIG. 11 illustrates example training results 1100. FIG. 11 provides examples of patterns based on the three different Vref_Qual 736 values 1002, 1004, 1006 illustrated in FIG. 10 that can indicate solid pass, solid fail or pass/fail transitions.

At block 908, the read traffic may be generated. The read traffic may be configured to include a deterministic number of read bursts and may include predefined patterns or sequences of data. At block 910, the results stored in the MISR may be read after the read bursts have been transmitted. These results may include patterns of captured state when rising edges are expected (rise MISR signatures) and patterns of captured state when falling edges are expected (fall MISR signatures). Rise MISR signatures and fall MISR signatures may be stored in a register or memory and the MISR may be reset. The MISR signatures may include different patterns of values for a qualifier slice, which corresponds to data captured for a common Vref_Qual 736 value. Elements of the patterns may include groups of all '0' state, all '1' state, all '0' state except for the last bit captured, and fail and/or indeterminate groups.

At block 912, it may be determined whether the immediately preceding rise MISR result represented a failure and the current rise MISR result included all '1' states. If not, then the procedure continues at block 916. If the immediately preceding rise MISR result represented a failure and the current MISR result included all '1' states, then at block 914, the CDC delay is configured to match the rise range start delay.

At block 916, it may be determined whether the current rise MISR result represented a failure and the immediately preceding rise MISR result included all '1' states. If not, then the procedure continues at block 920. If the current rise MISR result represented a failure and the immediately preceding rise MISR result included all '1' states, then at block 918, the rise MISR passing range is set such that:

Rise MISR passing range=current CDC delay−rise range start delay.

A "rise MISR done flag" may be set.

At block 920, it may be determined whether the immediately preceding fall MISR result represented a failure and the current fall MISR result included all '0' states. If not, then the procedure continues at block 924. If the immediately preceding fall MISR result represented a failure and the current fall MISR result included all '0' states, then at block 922, the CDC delay is configured to match the fall range start delay.

At block 924, it may be determined whether the current fall MISR result represented a failure and the immediately preceding fall MISR result included all '0' states. If not, then the procedure continues at block 928. If the current fall MISR result represented a failure and the immediately preceding fall MISR result included all '0' states, then at block 926, the fall MISR passing range is set such that:

Fall MISR passing range=current CDC delay−fall range start delay.

A "fall MISR done" flag may be set.

At block 924, the rise MISR done and the fall MISR done flags are considered. If either flag is not set then the procedure continues at block 934 where the CDC delay is increased by a step size defined for the CDC 808 and the procedure then resumes at block 908. If both flags are determined at block 924 to be set, then at block 930 the rise MISR passing range is compared to the fall MISR passing range. If the rise MISR passing range is not greater than the fall MISR passing range, then training can be completed at block 932 where the training result is provided as the current Vref_Qual voltage. The current Vref_Qual voltage may be recorded as the current value of the Vref_r1_sel signal 732. If the rise MISR passing range is determined to be greater than the fall MISR passing range at block 924, then the procedure continues at block 936 where the rise MISR done and the fall MISR done flags are cleared and the Vref_qual value is increased by a step size defined for the Qual voltage generator 722 and the procedure then resumes at block 906.

Figure 12:
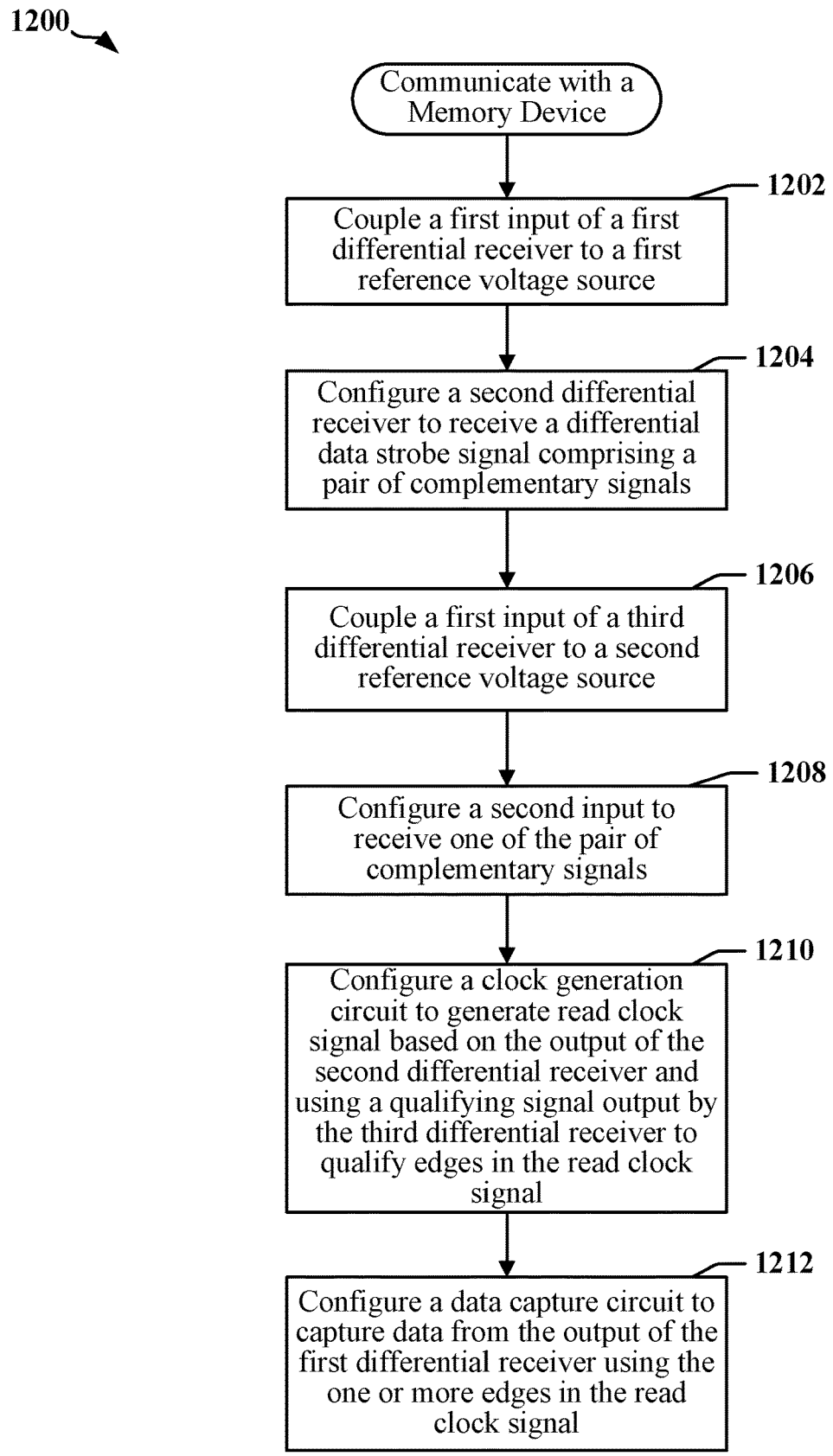
FIG. 12 is a flow diagram illustrating an example of a method for communicating with a memory device in accordance with certain aspects of the present disclosure.

FIG. 12 is a flow diagram illustrating an example of a method 1200 for communicating with a memory device in accordance with certain aspects of this disclosure. In one example, the method includes at least some portions of the methods illustrated in FIGS. 6 and 9. The method 1200 may be implemented in a memory PHY circuit in an SoC, for example.

At block 1202, a first input of a first differential receiver may be coupled to a first reference voltage source. At block 1204, a second differential receiver may be configured to receive a differential data strobe signal transmitted as a pair of complementary signals. At block 1206, a first input of a third differential receiver is coupled to a second reference voltage source. At block 1208, a second input of the third differential receiver is configured to receive one of the pair of complementary signals. At block 1210, a clock generation circuit is configured to generate a read clock signal based on the output of the second differential receiver and using a qualifying signal output by the third differential receiver to qualify one or more edges in the read clock signal. At block 1212, a data capture circuit is configured to capture data from the output of the first differential receiver using the one or more edges in the read clock signal.

In some implementations, a read capture window circuit is configured to provide a qualified strobe signal by gating the output of the second differential receiver with pulses generated from edges in the qualifying signal. The clock generation circuit may include a calibrated delay circuit configured to provide the read clock signal by applying a delay to the qualified strobe signal.

In some examples, the second reference voltage source can be trained by monitoring duty cycle of the qualifying signal for a plurality of values of a control signal provided to the second reference voltage source. The control signal may be used to configure the voltage level provided to the first input of the third differential receiver. The control signal may include or relay a multi-bit digital number. A plurality of samples of voltage levels of the qualifying signal may be captured. Each of the plurality of samples may be captured at different phases of the qualifying signal. The clock generation circuit may include a calibrated delay circuit that is configured to provide the read clock signal by applying a delay to the qualified strobe signal. For each of the plurality of samples, the calibrated delay circuit may be configured to select a phase of the qualifying signal by delaying a sampling edge in the qualifying signal. The data capture circuit may be used to capture the plurality of samples.

The first reference voltage source may be trained independently of the second reference voltage source. In one example, the first reference voltage source is trained before the second reference voltage source is trained. In another example, the first reference voltage source is trained after the second reference voltage source is trained.

In certain examples, the second reference voltage source provides a calibrated voltage level to the first input of the third differential receiver. The calibrated voltage level may be configured to obtain 50% duty cycle in the qualifying signal.

The apparatus and methods described herein and illustrated in the accompanying drawings may be implemented using various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system According to certain aspects of his disclosure, an apparatus configured to operate as a memory interface circuit includes circuits or modules configured to receive a data signal, including a first differential receiver having a first input coupled to a first reference voltage source, circuits or modules configured to receive a differential data strobe signal in a pair of complementary signals, circuits or modules configured to generate a qualifying signal by comparing one of the pair of complementary signals with an output of a second reference voltage source, circuits or modules configured to generate a read clock signal based on an output of the circuits or modules configured to receive the differential data strobe signal and circuits or modules configured to capture data from the output of the first differential receiver using the one or more edges in the read clock signal. In some instances, edges in the read clock signal are qualified using the qualifying signal.

In some examples, the read capture window circuit is configured to provide a qualified strobe signal by gating the output of the output of the circuits or modules configured to receive the differential data strobe signal with pulses generated from edges in the qualifying signal. The means for generating a read clock signal may include a calibrated delay circuit configured to provide the read clock signal by applying a delay to the qualified strobe signal. The second reference voltage source may be trained by monitoring duty cycle of the qualifying signal for a plurality of values of a control signal provided to the second reference voltage source. The control signal may configure a voltage level output by the second reference voltage source. The circuits or modules configured to capture data may be configured to capture a plurality of samples of voltage levels of the qualifying signal, each of the plurality of samples being captured at different phases of the qualifying signal.

The first reference voltage source may be trained independently of the second reference voltage source. In one example, the first reference voltage source is trained before the second reference voltage source is trained. In another example, the first reference voltage source is trained after the second reference voltage source is trained.

In some examples, the circuits or modules configured to generate a read clock signal includes a calibrated delay circuit configured to provide the read clock signal by applying a delay to a qualified strobe signal provided by the means for generating a read clock signal. The calibrated delay circuit may be configured to select a phase of the qualifying signal for each of the plurality of samples by delaying a sampling edge in the qualifying signal. The circuits or modules configured to capture data may be used to capture the plurality of samples.

In some examples, the output of a second reference voltage source has a calibrated voltage level. The calibrated voltage level may be configured to obtain a 50% duty cycle in the qualifying signal.

In accordance with at least one example described herein, a memory interface circuit has a first differential receiver configured with a first input coupled to a first reference voltage source, a second differential receiver configured to receive a differential data strobe signal in a pair of complementary signals, a third differential receiver having a first input coupled to a second reference voltage source and a second input configured to receive one of the pair of complementary signals, a clock generation circuit configured to generate a read clock signal based on an output of the second differential receiver and using a qualifying signal output by the third differential receiver to qualify one or more edges in the read clock signal and a data capture circuit clocked by the read clock signal and configured to capture data from the output of the first differential receiver using the one or more edges in the read clock signal.

In some examples, the clock generation circuit includes a read capture window circuit configured to provide a qualified strobe signal by gating the output of the second differential receiver with pulses generated from edges in the qualifying signal. The clock generation circuit may include a calibrated delay circuit configured to provide the read clock signal by applying a delay to the qualified strobe signal.

In certain examples, the memory interface circuit includes a controller configured to train the second reference voltage source by monitoring duty cycle of the qualifying signal for a plurality of values of a control signal provided to the second reference voltage source. The control signal may configure voltage level provided to the first input of the third differential receiver. The controller may be further configured to capture a plurality of samples of voltage levels of the qualifying signal, each of the plurality of samples being captured at different phases of the qualifying signal. The clock generation circuit may include a calibrated delay circuit configured to provide the read clock signal by applying a delay to a qualified strobe signal provided by the clock generation circuit. The controller may configure the calibrated delay circuit to select a phase of the qualifying signal for each of the plurality of samples by delaying a sampling edge in the qualifying signal. The data capture circuit can be used to capture the plurality of samples.

In some examples, the second reference voltage source provides a calibrated voltage level to the first input of the third differential receiver. The calibrated voltage level may be configured to obtain a 50% duty cycle in the qualifying signal.

In some implementations, certain functions or portions of functions may be implemented using software that resides in computer-readable form in a memory device or in other computer-readable medium. The computer-readable medium may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer.

In some implementations, the computer-readable medium maintains instructions and information where the instructions are configured to cause one or more processors or controllers to execute certain functions and processes. In some instances, the instructions and information may relate to the methods 600, 900, 1200 illustrated in FIGS. 6, 9 and 12.

In one example, a processor-readable storage medium stores or maintains code for configuring a voltage level provided by a first reference voltage source to a first input of a first differential receiver, configuring a second differential receiver to receive a differential data strobe signal in a pair of complementary signals, configuring a voltage level provided by a second reference voltage source to a first input of a third differential receiver which receives one of the pair of complementary signals at a second input, configuring a clock generation circuit to generate a read clock signal based on an output of the second differential receiver and using a qualifying signal output by the third differential receiver to qualify one or more edges in the read clock signal and causing a data capture circuit to capture data from the output of the first differential receiver using the one or more edges in the read clock signal.

In some examples, a read capture window circuit is configured to provide a qualified strobe signal by gating the output of the second differential receiver with pulses generated from edges in the qualifying signal. The clock generation circuit may include a calibrated delay circuit configured to provide the read clock signal by applying a delay to the qualified strobe signal.

In certain examples, the processor-readable storage medium includes code for training the second reference voltage source by monitoring duty cycle of the qualifying signal for a plurality of values of a control signal provided to the second reference voltage source. The control signal may configure the voltage level provided to the first input of the third differential receiver. A plurality of samples of voltage levels of the qualifying signal may be captured at different phases of the qualifying signal. The data capture circuit may be used to capture the plurality of samples. The clock generation circuit may include a calibrated delay circuit configured to provide the read clock signal by applying a delay to a qualified strobe signal provided by the clock generation circuit. The processor-readable storage medium may include code for configuring the calibrated delay circuit to select phases of the qualifying signal by delaying sampling edges in the qualifying signal.

The processor-readable storage medium may further include code for training the first reference voltage source. The first reference voltage source may be trained independently of the second reference voltage source. In one example, the first reference voltage source is trained before the second reference voltage source is trained. In another example, the first reference voltage source is trained after the second reference voltage source is trained.

Some implementation examples are described in the following numbered clauses:

1. A memory interface circuit comprising: a first differential receiver having a first input coupled to a first reference voltage source; a second differential receiver configured to receive a differential data strobe signal comprising a pair of complementary signals; a third differential receiver having a first input coupled to a second reference voltage source and a second input configured to receive one of the pair of complementary signals; a clock generation circuit configured to generate a read clock signal based on an output of the second differential receiver and using a qualifying signal output by the third differential receiver to qualify one or more edges in the read clock signal; and a data capture circuit clocked by the read clock signal and configured to capture data from the output of the first differential receiver using the one or more edges in the read clock signal.
2. The memory interface circuit as described in clause 1, wherein the clock generation circuit comprises: a read capture window circuit configured to provide a qualified strobe signal by gating the output of the second differential receiver with pulses generated from edges in the qualifying signal.
3. The memory interface circuit as described in clause 2, wherein the clock generation circuit comprises: a calibrated delay circuit configured to provide the read clock signal by applying a delay to the qualified strobe signal.
4. The memory interface circuit as described in any of clauses 1-3, further comprising a controller configured to: train the second reference voltage source by monitoring duty cycle of the qualifying signal for a plurality of values of a control signal provided to the second reference voltage source, wherein the control signal configures voltage level provided to the first input of the third differential receiver.
5. The memory interface circuit as described in clause 4, wherein the controller is further configured to: train the first reference voltage source, wherein the first reference voltage source and the second reference voltage source are trained independently from each other.
6. The memory interface circuit as described in clause 4 or clause 5, wherein the controller is further configured to: capture a plurality of samples of voltage levels of the qualifying signal, each of the plurality of samples being captured at different phases of the qualifying signal.
7. The memory interface circuit as described in clause 6, wherein the clock generation circuit comprises: a calibrated delay circuit configured to provide the read clock signal by applying a delay to a qualified strobe signal provided by the clock generation circuit, wherein the controller is further configured to: for each of the plurality of samples, configure the calibrated delay circuit to select a phase of the qualifying signal by delaying a sampling edge in the qualifying signal.
8. The memory interface circuit as described in clause 6 or clause 7, wherein the data capture circuit is used to capture the plurality of samples.
9. The memory interface circuit as described in any of clauses 1-8, wherein the second reference voltage source provides a calibrated voltage level to the first input of the third differential receiver, and wherein the calibrated voltage level is configured to obtain a 50% duty cycle in the qualifying signal.
10. A method for communicating with a memory device comprising: coupling a first input of a first differential receiver to a first reference voltage source; configuring a second differential receiver to receive a differential data strobe signal comprising a pair of complementary signals; coupling a first input of a third differential receiver to a second reference voltage source; configuring a second input of the third differential receiver to receive one of the pair of complementary signals; configuring a clock generation circuit to generate a read clock signal based on an output of the second differential receiver and using a qualifying signal output by the third differential receiver to qualify one or more edges in the read clock signal; and configuring a data capture circuit to capture data from the output of the first differential receiver using the one or more edges in the read clock signal.

11. The method as described in clause 9, further comprising: configuring a read capture window circuit to provide a qualified strobe signal by gating the output of the second differential receiver with pulses generated from edges in the qualifying signal, wherein the clock generation circuit comprises a calibrated delay circuit configured to provide the read clock signal by applying a delay to the qualified strobe signal 1.

12. The method as described in clause 10 or clause 11, further comprising: training the second reference voltage source by monitoring duty cycle of the qualifying signal for a plurality of values of a control signal provided to the second reference voltage source, wherein the control signal configures a voltage level provided to the first input of the third differential receiver.

13. The method as described in clause 12, further comprising: training the first reference voltage source, wherein the first reference voltage source and the second reference voltage source are trained independently from each other.

14. The method as described in clause 12 or clause 13, further comprising: capturing a plurality of samples of voltage levels of the qualifying signal, each of the plurality of samples being captured at different phases of the qualifying signal.

15. The method as described in clause 14, wherein the clock generation circuit comprises a calibrated delay circuit configured to provide the read clock signal by applying a delay to a qualified strobe signal provided by the clock generation circuit, further comprising: for each of the plurality of samples, configuring the calibrated delay circuit to select a phase of the qualifying signal by delaying a sampling edge in the qualifying signal.

16. The method as described in clause 14 or clause 15, wherein the data capture circuit is used to capture the plurality of samples.

17. The method as described in any of clauses 10-16, wherein the second reference voltage source provides a calibrated voltage level to the first input of the third differential receiver, and wherein the calibrated voltage level is configured to obtain a 50% duty cycle in the qualifying signal.

18. An apparatus comprising: means for receiving a data signal, including a first differential receiver having a first input coupled to a first reference voltage source; means for receiving a differential data strobe signal comprising a pair of complementary signals; means for generating a qualifying signal by comparing one of the pair of complementary signals with an output of a second reference voltage source; means for generating a read clock signal based on an output of the means for receiving the differential data strobe signal, wherein edges in the read clock signal are qualified using the qualifying signal; and means for capturing data, configured to capture data from the output of the first differential receiver using the one or more edges in the read clock signal.

19. The apparatus as described in clause 18, wherein the read capture window circuit is configured to provide a qualified strobe signal by gating the output of the output of the means for receiving the differential data strobe signal with pulses generated from edges in the qualifying signal, and wherein the means for generating a read clock signal comprises a calibrated delay circuit configured to provide the read clock signal by applying a delay to the qualified strobe signal.

20. The apparatus as described in clause 18 or clause 19, wherein the second reference voltage source is trained by monitoring duty cycle of the qualifying signal for a plurality of values of a control signal provided to the second reference voltage source, wherein the control signal configures a voltage level output by the second reference voltage source.

21. The apparatus as described in clause 20, wherein the first reference voltage source and the second reference voltage source are independently trained with respect to each other.

22. The apparatus as described in clause 20 or clause 21, wherein the means for capturing data is configured to: capture a plurality of samples of voltage levels of the qualifying signal, each of the plurality of samples being captured at different phases of the qualifying signal.

23. The apparatus as described in clause 22, wherein the means for generating a read clock signal comprises: a calibrated delay circuit configured to provide the read clock signal by applying a delay to a qualified strobe signal provided by the means for generating a read clock signal, and wherein for each of the plurality of samples the calibrated delay circuit is configured to select a phase of the qualifying signal by delaying a sampling edge in the qualifying signal.

24. The apparatus as described in clause 22 or clause 23, wherein the means for capturing data is used to capture the plurality of samples.

25. A processor-readable storage medium comprising code for: configuring a voltage level provided by a first reference voltage source to a first input of a first differential receiver; configuring a second differential receiver to receive a differential data strobe signal comprising a pair of complementary signals; configuring a voltage level provided by a second reference voltage source to a first input of a third differential receiver, wherein a second input of the third differential receiver receives one of the pair of complementary signals; configuring a clock generation circuit to generate a read clock signal based on an output of the second differential receiver and using a qualifying signal output by the third differential receiver to qualify one or more edges in the read clock signal; and causing a data capture circuit to capture data from the output of the first differential receiver using the one or more edges in the read clock signal.

26. The processor-readable storage medium as described in clause 25, wherein a read capture window circuit is configured to provide a qualified strobe signal by gating the output of the second differential receiver with pulses generated from edges in the qualifying signal, and wherein the clock generation circuit comprises a calibrated delay circuit configured to provide the read clock signal by applying a delay to the qualified strobe signal.

27. The processor-readable storage medium as described in clause 25 or clause 26, further comprising code for: training the second reference voltage source by monitoring duty cycle of the qualifying signal for a plurality of values of a control signal provided to the second reference voltage source, wherein the control signal configures the voltage level provided to the first input of the third differential receiver.

28. The processor-readable storage medium as described in clause 27, further comprising code for: training the first reference voltage source, wherein the first reference voltage source and the second reference voltage source are trained independently from each other.

29. The processor-readable storage medium as described in clause 27 or clause 28, wherein a plurality of samples of voltage levels of the qualifying signal are captured at different phases of the qualifying signal, wherein the data capture circuit is used to capture the plurality of samples.

30. The processor-readable storage medium as described in clause 29, wherein the clock generation circuit comprises a calibrated delay circuit configured to provide the read clock signal by applying a delay to a qualified strobe signal provided by the clock generation circuit, further comprising code for: configuring the calibrated delay circuit to select phases of the qualifying signal by delaying sampling edges in the qualifying signal.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory interface circuit comprising:
a first differential receiver having a first input coupled to a first reference voltage source;
a second differential receiver configured to receive a differential data strobe signal comprising a pair of complementary signals;
a third differential receiver having a first input coupled to a second reference voltage source and a second input configured to receive one of the pair of complementary signals;
a clock generation circuit configured to generate a read clock signal based on an output of the second differential receiver and using a qualifying signal output by the third differential receiver to qualify one or more edges in the read clock signal; and
a data capture circuit clocked by the read clock signal and configured to capture data from the output of the first differential receiver using the one or more edges in the read clock signal.

2. The memory interface circuit of claim 1, wherein the clock generation circuit comprises:
a read capture window circuit configured to provide a qualified strobe signal by gating the output of the second differential receiver with pulses generated from edges in the qualifying signal.

3. The memory interface circuit of claim 2, wherein the clock generation circuit comprises:
a calibrated delay circuit configured to provide the read clock signal by applying a delay to the qualified strobe signal.

4. The memory interface circuit of claim 1, further comprising a controller configured to:
train the second reference voltage source by monitoring duty cycle of the qualifying signal for a plurality of values of a control signal provided to the second reference voltage source, wherein the control signal configures voltage level provided to the first input of the third differential receiver.

5. The memory interface circuit of claim 4, wherein the controller is further configured to:
train the first reference voltage source, wherein the first reference voltage source and the second reference voltage source are trained independently from each other.

6. The memory interface circuit of claim 4, wherein the controller is further configured to:
capture a plurality of samples of voltage levels of the qualifying signal, each of the plurality of samples being captured at different phases of the qualifying signal.

7. The memory interface circuit of claim 6, wherein the clock generation circuit comprises:
a calibrated delay circuit configured to provide the read clock signal by applying a delay to a qualified strobe signal provided by the clock generation circuit,
wherein the controller is further configured to:
for each of the plurality of samples, configure the calibrated delay circuit to select a phase of the qualifying signal by delaying a sampling edge in the qualifying signal.

8. The memory interface circuit of claim 6, wherein the data capture circuit is used to capture the plurality of samples.

9. The memory interface circuit of claim 1, wherein the second reference voltage source provides a calibrated voltage level to the first input of the third differential receiver, and wherein the calibrated voltage level is configured to obtain a 50% duty cycle in the qualifying signal.

10. A method for communicating with a memory device comprising:
coupling a first input of a first differential receiver to a first reference voltage source;
configuring a second differential receiver to receive a differential data strobe signal comprising a pair of complementary signals;
coupling a first input of a third differential receiver to a second reference voltage source;
configuring a second input of the third differential receiver to receive one of the pair of complementary signals;
configuring a clock generation circuit to generate a read clock signal based on an output of the second differential receiver and using a qualifying signal output by the third differential receiver to qualify one or more edges in the read clock signal; and
configuring a data capture circuit to capture data from the output of the first differential receiver using the one or more edges in the read clock signal.

11. The method of claim 10, further comprising:
configuring a read capture window circuit to provide a qualified strobe signal by gating the output of the second differential receiver with pulses generated from edges in the qualifying signal, wherein the clock generation circuit comprises a calibrated delay circuit configured to provide the read clock signal by applying a delay to the qualified strobe signal.

12. The method of claim 10, further comprising:
training the second reference voltage source by monitoring duty cycle of the qualifying signal for a plurality of values of a control signal provided to the second reference voltage source, wherein the control signal configures a voltage level provided to the first input of the third differential receiver.

13. The method of claim 12, further comprising:
training the first reference voltage source, wherein the first reference voltage source and the second reference voltage source are trained independently from each other.

14. The method of claim 12, further comprising:
capturing a plurality of samples of voltage levels of the qualifying signal, each of the plurality of samples being captured at different phases of the qualifying signal.

15. The method of claim 14, wherein the clock generation circuit comprises a calibrated delay circuit configured to provide the read clock signal by applying a delay to a qualified strobe signal provided by the clock generation circuit, further comprising:
for each of the plurality of samples, configuring the calibrated delay circuit to select a phase of the qualifying signal by delaying a sampling edge in the qualifying signal.

16. The method of claim 14, wherein the data capture circuit is used to capture the plurality of samples.

17. The method of claim 10, wherein the second reference voltage source provides a calibrated voltage level to the first input of the third differential receiver, and wherein the calibrated voltage level is configured to obtain a 50% duty cycle in the qualifying signal.

18. An apparatus comprising:
means for receiving a data signal, including a first differential receiver having a first input coupled to a first reference voltage source;
means for receiving a differential data strobe signal comprising a pair of complementary signals;
means for generating a qualifying signal by comparing one of the pair of complementary signals with an output of a second reference voltage source;
means for generating a read clock signal based on an output of the means for receiving the differential data strobe signal, wherein one or more edges in the read clock signal are qualified using the qualifying signal; and
means for capturing data, configured to capture data from the output of the first differential receiver using the one or more edges in the read clock signal.

19. The apparatus of claim 18, wherein the read capture window circuit is configured to provide a qualified strobe signal by gating the output of the output of the means for receiving the differential data strobe signal with pulses generated from edges in the qualifying signal, and wherein the means for generating a read clock signal comprises a calibrated delay circuit configured to provide the read clock signal by applying a delay to the qualified strobe signal.

20. The apparatus of claim 18, wherein the second reference voltage source is trained by monitoring duty cycle of the qualifying signal for a plurality of values of a control signal provided to the second reference voltage source, wherein the control signal configures a voltage level output by the second reference voltage source.

21. The apparatus of claim 20, wherein the first reference voltage source and the second reference voltage source are independently trained with respect to each other.

22. The apparatus of claim 20, wherein the means for capturing data is configured to:
capture a plurality of samples of voltage levels of the qualifying signal, each of the plurality of samples being captured at different phases of the qualifying signal.

23. The apparatus of claim 22, wherein the means for generating a read clock signal comprises:
a calibrated delay circuit configured to provide the read clock signal by applying a delay to a qualified strobe signal provided by the means for generating a read clock signal, and
wherein for each of the plurality of samples the calibrated delay circuit is configured to select a phase of the qualifying signal by delaying a sampling edge in the qualifying signal.

24. The apparatus of claim 22, wherein the means for capturing data is used to capture the plurality of samples.

25. A processor-readable storage medium comprising code for:
configuring a voltage level provided by a first reference voltage source to a first input of a first differential receiver;
configuring a second differential receiver to receive a differential data strobe signal comprising a pair of complementary signals;
configuring a voltage level provided by a second reference voltage source to a first input of a third differential receiver, wherein a second input of the third differential receiver receives one of the pair of complementary signals;
configuring a clock generation circuit to generate a read clock signal based on an output of the second differential receiver and using a qualifying signal output by the third differential receiver to qualify one or more edges in the read clock signal; and
causing a data capture circuit to capture data from the output of the first differential receiver using the one or more edges in the read clock signal.

26. The processor-readable storage medium of claim 25, wherein a read capture window circuit is configured to provide a qualified strobe signal by gating the output of the second differential receiver with pulses generated from edges in the qualifying signal, and wherein the clock generation circuit comprises a calibrated delay circuit configured to provide the read clock signal by applying a delay to the qualified strobe signal.

27. The processor-readable storage medium of claim 25, further comprising code for:
training the second reference voltage source by monitoring duty cycle of the qualifying signal for a plurality of values of a control signal provided to the second reference voltage source, wherein the control signal configures the voltage level provided to the first input of the third differential receiver.

28. The processor-readable storage medium of claim 27, further comprising code for:
    training the first reference voltage source, wherein the first reference voltage source and the second reference voltage source are trained independently from each other.

29. The processor-readable storage medium of claim 27, wherein a plurality of samples of voltage levels of the qualifying signal are captured at different phases of the qualifying signal, wherein the data capture circuit is used to capture the plurality of samples.

30. The processor-readable storage medium of claim 29, wherein the clock generation circuit comprises a calibrated delay circuit configured to provide the read clock signal by applying a delay to a qualified strobe signal provided by the clock generation circuit, further comprising code for:
    configuring the calibrated delay circuit to select phases of the qualifying signal by delaying sampling edges in the qualifying signal.

* * * * *